United States Patent
Kubo et al.

(12) 
(10) Patent No.: US 6,465,540 B1
(45) Date of Patent: Oct. 15, 2002

(54) ULTRAVIOLET CURABLE RESIN COMPOSITION AND PHOTO SOLDER RESIST INK USING THE SAME

(75) Inventors: Tatsuya Kubo, Soraku-gun; Masatoshi Fujimoto, Uji; Soichi Hashimoto, Kyotanabe, all of (JP)

(73) Assignee: Goo Chemical Co., Ltd., Kyoto (JP)

( * ) Notice: Subject to any disclaimer, the term of this patent is extended or adjusted under 35 U.S.C. 154(b) by 0 days.

(21) Appl. No.: 09/525,932

(22) Filed: Mar. 14, 2000

(30) Foreign Application Priority Data

Mar. 17, 1999 (JP) ............................................. 11-072809
Mar. 1, 2000 (JP) ....................................... 2000-055760

(51) Int. Cl.⁷ ................................................. C08F 4/50
(52) U.S. Cl. ...................... 522/100; 522/101; 522/103; 522/170; 522/181; 430/269; 430/270.1; 430/280.1; 430/281.1; 430/286.1; 430/287.1; 430/288.1; 428/416; 428/413
(58) Field of Search ................................. 522/100, 101, 522/103, 170, 181; 528/306; 525/925; 430/75, 80, 269, 270.1, 280.1, 281.1, 286.1, 287.1, 288.1; 428/413, 416

(56) References Cited

U.S. PATENT DOCUMENTS

| | | | |
|---|---|---|---|
| 4,888,269 A | * 12/1989 | Sato et al. | .................. 430/280 |
| 5,539,064 A | 7/1996 | Hashimoto et al. | |
| 5,821,031 A | 10/1998 | Hashimoto et al. | |

FOREIGN PATENT DOCUMENTS

| | | |
|---|---|---|
| EP | 0 733 683 A1 | 9/1996 |
| EP | 0 864 926 A1 | 9/1998 |
| JP | 08211611 A | 8/1986 |
| JP | 61243869 A | 10/1986 |
| JP | 07020631 A | 1/1995 |
| JP | 08335768 A | 12/1996 |
| JP | 09185166 A | 7/1997 |
| JP | 09235348 A | 9/1997 |
| JP | 09235356 A | 9/1997 |
| JP | 10139843 A | 5/1998 |
| JP | 11311858 A | 11/1999 |

* cited by examiner

*Primary Examiner*—James J. Seidleck
*Assistant Examiner*—Sanza L. McClendon
(74) *Attorney, Agent, or Firm*—Rader, Fishman & Grauer PLLC

(57) ABSTRACT

An ultraviolet curable resin composition includes (A) an ultraviolet curable resin, (B) an epoxy compound having at least two epoxy groups in one molecule, (C) a photopolymerization initiator and (D) a diluent. The ultraviolet curable resin (A) is obtained by the steps of polymerizing an ethylenically unsaturated monomer component containing (a) an ethylenically unsaturated monomer having epoxy group and (b) a compound having at least two ethylenically unsaturated groups in one molecule to prepare a copolymer, reacting the copolymer with (c) an ethylenically unsaturated monomer having carboxyl group to prepare a chemical intermediate, and reacting the chemical intermediate with (d) one of saturated and unsaturated polybasic acid anhydrides. This resin composition will be preferably used to prepare a photo solder resist ink developable with diluted alkaline aqueous solution.

11 Claims, No Drawings

ULTRAVIOLET CURABLE RESIN COMPOSITION AND PHOTO SOLDER RESIST INK USING THE SAME

BACKGROUND OF THE INVENTION

1. Field of the Invention

The present invention relates to an ultraviolet curable resin composition, which can be used in application fields such as ultraviolet-curable and thermosetting type photo solder resist inks developable with diluted alkaline aqueous solution, pixels, and protective films for color filter, and also a photo solder resist ink using the same ultraviolet curable resin composition, which will be preferably utilized to manufacture printed wiring boards having fine-line, dense conductive pattern.

2. Disclosure of the Prior Art

In the field of printed wiring boards having fine-line, dense conductive pattern, liquid-type photo solder resist inks developable with diluted alkaline aqueous solution are preferably used. For example, Japanese Patent Early Publication No. 61-243869 discloses a photo solder resist ink containing an ultraviolet curable resin developable with a diluted alkaline aqueous solution, photopolymerization initiator, and an epoxy compound. To provide the developability with diluted alkaline aqueous solution, the ultraviolet curable resin has a sufficient amount of carboxyl group.

However, since the photo solder resist ink contains the epoxy compound, a thermosetting reaction between the carboxyl group in the ultraviolet curable resin and the epoxy compound easily occurs under a predrying condition, so that there is a problem that the developability and resolution deteriorate. Due to this reason, an amount used of the epoxy compound is limited within a narrow range, in which the above problem does not occur. As a result, effects of the epoxy compound, i.e., improvements in heat resistance to molten solder, electrical corrosion resistance and so on, are not sufficiently obtained. Thus, the photo solder resist ink of the prior art still has room for improvement.

SUMMARY OF THE INVENTION

Therefore, the present invention is directed to an ultraviolet curable resin composition capable of providing the following advantages.

(1) The resin composition is excellent in developability, resolution, and heat resistance to molten solder.

(2) The resin composition provides a wide developing width. The developing width means a width of predrying condition, in which the developability can be maintained. The developing width is also called a predrying control width or predrying acceptable range.

(3) The resin composition can be used to prepare a photo solder resist ink developable with diluted alkaline aqueous solution, which is capable of providing a solder resist film having an improved adhesion to substrate, excellent electrical corrosion resistance, great heat resistance to molten solder and resistance to gold plating.

That is, the ultraviolet curable resin composition of the present invention includes:

(A) an ultraviolet curable resin obtained by the steps of: polymerizing an ethylenically unsaturated monomer component containing (a) an ethylenically unsaturated monomer having epoxy group and (b) a compound having at least two ethylenically unsaturated groups in one molecule to prepare a copolymer; reacting the copolymer with (c) an ethylenically unsaturated monomer having carboxyl group to prepare a chemical intermediate; and reacting the chemical intermediate with (d) a saturated or unsaturated polybasic acid anhydride;

(B) an epoxy compound having at least two epoxy groups in one molecule;

(C) a photopolymerization initiator; and (D) a diluent.

It is preferred that the compound (b) is di(meth)acrylate, and particularly di(meth)acrylate having at least one oxyalkylene unit. It is also preferred that an amount of the compound (b) is within a range of 0.1 to 10 mol %, and more preferably 0.1 to 7 mol % with respect to the total amount of the ethylenically unsaturated monomer component used to prepare the copolymer.

In a preferred embodiment of the present invention, the ethylenically unsaturated monomer component further contains (e) an ethylenically unsaturated monomer capable of copolymerizing with the ethylenically unsaturated monomer (a) and the compound (b). In this case, it is possible to suitably adjust the photocurability and properties of a cured film of the resin composition.

It is particularly preferred that the ethylenically unsaturated monomer (a) includes glycidyl (meth)acrylate.

The present invention is also directed to a photo solder resist ink comprising the ultraviolet curable resin composition explained above. Since the resin composition contains the ultraviolet curable resin (A) with the improved heat resistance and softening point, the photo solder resist ink can exhibit excellent developability, resolution, developing width, and heat resistance to molten solder.

The present invention further concerns a predried film obtained by drying the ultraviolet curable resin composition or the photo solder resist ink described above, and a printed wiring board having a cured film of the ultraviolet curable resin composition or the photo solder resist ink described above.

These and still other objects and advantages will become apparent from the following detail descriptions of the preferred embodiments and examples of the invention.

DETAILED DESCRIPTION OF THE INVENTION

[(A) ultraviolet curable resin]

The ultraviolet curable resin composition of the present invention includes an ultraviolet curable resin (A). The ultraviolet curable resin (A) is prepared by the following steps. First, an ethylenically unsaturated monomer component containing (a) an ethylenically unsaturated monomer having epoxy group and (b) a compound having at least two ethylenically unsaturated groups in one molecule is polymerized to obtain a copolymer. Then, the copolymer is reacted with (c) an ethylenically unsaturated monomer having carboxyl group to obtain a chemical intermediate. In addition, the chemical intermediate is reacted with (d) a saturated or unsaturated polybasic acid anhydride to obtain the ultraviolet curable resin (A).

<(a) ethylenically unsaturated monomer having epoxy group>

The principal purpose of compounding the ethylenically unsaturated monomer (a) is to introduce epoxy group into the copolymer, and provide photocurability based on ethylenically unsaturated double bond to the copolymer when the copolymer is reacted with the ethylenically unsaturated monomer (c) having carboxyl group. Therefore, the photocurability of the ultraviolet curable resin (A) depends on an amount of the ethylenically unsaturated monomer (a) used to prepare the copolymer. In the present invention, it is preferred that the amount of the ethylenically unsaturated monomer (a) is within a range of 40 to 99.9 mol %, and more preferably 55 to 95 mol % with respect to a total amount of the ethylenically unsaturated monomer component used to prepare the copolymer. When the amount is less than 40 mol %, the photocurability may become poor, and sufficient sensitivity and resolution for patterning may not be obtained. In addition, when a solder resist is formed by use of a photo solder resist ink including the ultraviolet curable resin composition of the present invention, some properties of the solder resist such as heat resistance to molten solder may become insufficient. When the amount is within the range of 55 to 95 mol %, the solder resist exhibits further improved heat resistance to molten solder and electrical corrosion resistance.

As the ethylenically unsaturated monomer (a), for example, it is possible to use glycidyl (meth)acrylate, epoxy cyclohexyl derivative of (meth)acrylic acid such as (3, 4-epoxy cyclohexyl)methyl (meth)acrylate, alicyclic epoxy derivative of (meth)acrylate, β-methyl glycidyl (meth) acrylate or dipropylene glycol di(meth)acrylate. The ethylenically unsaturated monomer (a) can be one of these materials or a combination of two or more of these materials. In particular, it is preferred to use glycidyl (meth)acrylate.

In the present specification, "(meth)acrylic acid" means "acrylic acid" and "methacrylic acid", and "(meth)acrylic-" means "acrylic-" and "methacrylic-".

<(b) compound having at least two ethylenically unsaturated groups in one molecule>

The principal purpose of compounding the compound (b) having at least two ethylenically unsaturated groups in one molecule is to improve the heat resistance, developability and the softening point of the copolymer. In the present invention, it is preferred that an amount of the compound (b) is within a range of 0.1 to 10 mol %, and preferably 0.1 to 7 mol % with respect to the total amount of the ethylenically unsaturated monomer component used to prepare the copolymer. When the amount is less than 0.1 mol %, the heat resistance to molten solder may become insufficient. On the other hand, when the amount is more than 10 mol %, gelation may occur due to excessive copolymerization. In addition, since the amount of the ethylenically unsaturated monomer (a) in the copolymer is relatively reduced, there is a fear that the photocurability of the ultraviolet curable resin composition becomes insufficient. When the amount is within the range of 0.1 to 7 mol %, both of improved heat resistance and better polymerization performance can be achieved.

As the compound (b), for example, it is possible to use a compound having two ethylenically unsaturated groups in one molecule such as diethylene glycol di(meth)acrylate, triethylene glycol di(meth)acrylate, polyethylene glycol di(meth)acrylate, propylene glycol di(meth)acrylate, tripropylene glycol di(meth)acrylate, polypropylene glycol di(meth)acrylate, EOPO-denatured di(meth)acrylate, bisphenol AEO adduct di(meth)acrylate, bisphenol FEO adduct di(meth)acrylate, bisphenol APO adduct di(meth) acrylate, bisphenol AEOPO adduct di(meth)acrylate, 1,6-hexanediol di(meth)acrylate, neopentyl glycol di(meth) acrylate, trimethylol propane di(meth)acrylate, cyclopentanyl di(meth)acrylate, or cyclopentenyl di(meth) acrylate. In addition, it is possible to use a compound having three or more ethylenically unsaturated groups in one molecule such as trimethylol propane tri(meth)acrylate, pentaerytritol tri(meth)acrylate, pentaerythritol tetra(meth) acrylate, dipentaerythritol penta(meth)acrylate, dipentaerythritol hexa(meth)acrylate, di-, tri- or more polyester obtained by a reaction between polybasic acid and hydroxy (meth)alkylacrylate, or polyester (meth)acrylate. The compound (b) can be one of these materials or a combination of two or more of these materials. The compound (b) is useful to reinforce the main chain of the copolymer. Therefore, the heat resistance to molten solder and the developing width can be improved, and the softening point of the copolymer can be easily adjusted.

In the present invention, di(meth)acrylate is preferably used as the compound (b). For example, as di(meth)acrylate, it is possible to use a compound having at least one oxyalkylene unit in molecule such as oxyethylene or oxypropylene. In this case, it is possible to improve the heat resistance to molten solder of the ultraviolet curable resin composition, and particularly provide excellent developing width. It is preferred that the number of oxyalkylene unit in one molecule of di(meth)acrylate is within a range of 1 to 40, preferably 4 to 30, and more preferably 4 to 10. When this condition is satisfied, the reaction for preparing the ultraviolet curable resin (A) stably proceeds, so that the developing width of the ultraviolet curable resin composition is widened, and the heat resistance to molten solder of a cured film of the resin composition is improved.

To provide excellent heat resistance to molten solder and developing width, it is particularly preferred to use di(meth) acrylate having the oxyalkylene unit or the oxyalkylene unit and a bisphenol skeleton as the compound (b). As di(meth) acrylate having the oxyalkylene unit, it is possible to use polyethylene glycol dimethacrylate or ethylene glycol dimethacrylate, which is expressed by the following general formula (1),

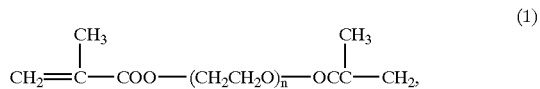

wherein "n" is an integer selected from a range of 1 to 40. In addition, it is possible to use polypropylene glycol dimethacrylate or propylene glycol dimethacrylate, which is expressed by the following general formula (2),

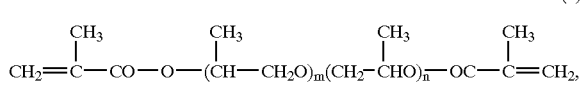

wherein each of "n" and "m" is an integer of 0 or more, and a sum of "n" and "m" is within a range of 1 to 40. Alternatively, it is possible to use polyethylene glycol diacrylate or ethylene glycol diacrylate, which is expressed by the following general formula (3),

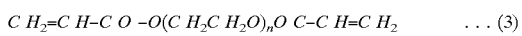

wherein "n" is an integer selected from a range of 1 to 40.

On the other hand, as di(meth)alkylate having the oxyalkylene unit and the bisphenol skeleton, it is possible to use a compound expressed by the following general formula (4),

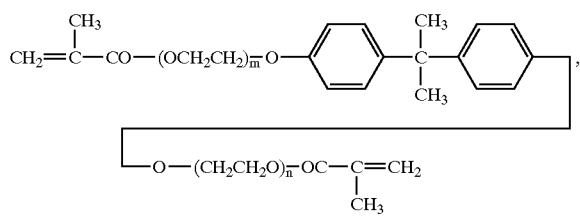

(4)

wherein each of "n" and "m" is an integer of 0 or more, and a sum of "n" and "m" is within a range of 1 to 40. For example, as such a compound, it is possible to use 2, 2-bis[4-(methacryloxy ethoxy)phenyl] propane, 2, 2,-bis[4-(methacryloxy.diethoxy)phenyl] propane, or 2, 2-bis[4-(methacryloxy.polyethoxy)phenyl] propane. In addition, it is possible to use a compound expressed by the following general formula

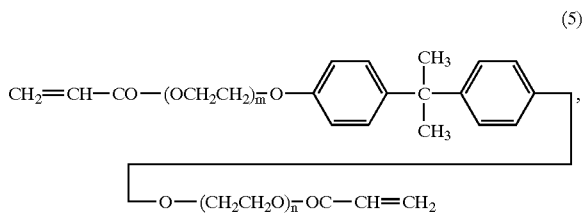

(5)

wherein each of "n" and "m" is an integer of 0 or more, and a sum of "n" and "m" is within a range of 1 to 40. For example, as such a compound, it is possible to use 2, 2-bis[4-(acryloxy ethoxy)phenyl] propane, 2, 2-bis[4-(acryloxy.diethoxy)phenyl] propane, or 2, 2-bis[4-(acryloxy.polyethoxy)phenyl] propane. Moreover, it is possible to use bisphenol-A polyethylene glycol polypropylene glycol adduct dimethacrylate.

Concretely, as the (meth)acrylate having oxyalkylene unit, it is possible to use "NK Ester 4G" expressed by the formula (1) [manufactured by SHINNAKAMURA CHEMICAL INDUSTRIAL CO., LTD., polyethylene glycol #200 dimethacrylate (average value of "n": 4)], "NK Ester 9G" expressed by the formula (1) [manufactured by SHINNAKAMURA CHEMICAL INDUSTRIAL CO., LTD., polyethylene glycol #400 dimethacrylate (average value of "n": 9)], "NK Ester 9PG" expressed by the formula (2) [manufactured by SHINNAKAMURA CHEMICAL INDUSTRIAL CO., LTD., polypropylene glycol #400 dimethacrylate (average value of "m+n": 7)], "NK Ester A-200" expressed by the formula (3) [manufactured by SHINNAKAMURA CHEMICAL INDUSTRIAL CO., LTD., polyethylene glycol #200 diacrylate (average value of "n": 4)], "NK Ester A-400" expressed by the formula (3) [manufactured by SHINNAKAMURA CHEMICAL INDUSTRIAL CO., LTD., polyethylene glycol #400 diacrylate (average value of "n": 9)], and "NK Ester A-600" expressed by the formula (3) [manufactured by SHINNAKAMURA CHEMICAL INDUSTRIAL CO., LTD., polyethylene glycol #600 diacrylate (average value of "n": 14)].

On the other hand, as the di(meth)acrylate having oxyalkylene unit and bisphenol skeleton, it is possible to use "NK Ester-BPE-100" expressed by the formula (4) [manufactured by SHINNAKAMURA CHEMICAL INDUSTRIAL CO., LTD., 2, 2-bis[4-(methacryloxy ethoxy) phenyl] propane (average value of "n+m": 2.6)], "NK Ester-BPE-200" expressed by the formula (4) [manufactured by SHINNAKAMURA CHEMICAL INDUSTRIAL CO., LTD., 2, 2-bis[4-(methacryloxy.diethoxy)phenyl] propane (average value of "n+m": 4)], "NK Ester-BPE-500" expressed by the formula (4) [manufactured by SHINNAKAMURA CHEMICAL INDUSTRIAL CO., LTD., 2, 2-bis [4-(methacryloxy.polyethoxy)phenyl] propane (average value of "n+m": 10)], "NK Ester A-BPE-4" expressed by the formula (5) [manufactured by SHINNAKAMURA CHEMICAL INDUSTRIAL CO., LTD., 2,2-bis[4-(acryloxy.diethoxy)phenyl] propane (average value of "n+m": 4)], and "Blemmer 43 DB-40B" [manufactured by NOF Corp., bisphenol-A polyethylene glycol polypropylene glycol adduct dimethacrylate].

If necessary, the ethylenically unsaturated monomer component used to prepare the copolymer can contain (e) an ethylenically unsaturated monomer capable of copolymerizing with the ethylenically unsaturated monomer (a) and the compound (b). For example, it is possible to use a straight-chained or branch-chained alkyl ester of (meth)acrylic acid, (meth)acrylic acid alicyclic ester (this ester may have unsaturated bond at a portion in the ring.) such as methyl (meth)acrylate, ethyl (meth)acrylate, propyl (meth)acrylate, butyl (meth)acrylate, isobutyl (meth)acrylate, t-butyl (meth) acrylate, 2-ethyl hexyl (meth)acrylate, n-octyl (meth) acrylate, n-decyl (meth)acrylate, isodecyl (meth)acrylate, lauryl (meth)acrylate, myristyl (meth)acrylate, cetyl (meth) acrylate, stearyle (meth)acrylate, cyclohexyl (meth)acrylate, and isobornyl (meth)acrylate, ethylene glycol ester (meth) acrylate such as hydroxy ethyl (meth)acrylate, methoxy ethyl (meth)acrylate, ethoxy ethyl (meth)acrylate, diethylene glycol mono(meth)acrylate, triethylene glycol mono (meth)acrylate and methoxy diethylene glycol mono(meth) acrylate, propylene glycol (meth)acrylate, butylene glycol mono(meth)acrylate, glycerol mono(meth)acrylate, or aromatic (meth)acrylate such as benzyl (meth)acrylate, (meth) acrylamide compound such as (meth)acrylamide, N-methyl (meth)acrylamide, N-propyl (meth)acrylamide, N-t-butyl (meth)acrylamide, N-t-octyl (meth)acrylamide and diacetone (meth)acrylamide, maleimide compound such as N-phenyl maleimide, N-(2-methyl phenyl) maleimide, N-cyclohexyl maleimide, N-(2,6-diethyl phenyl) maleimide, N-lauryl maleimide and N-benzyl maleimide, vinyl pyrrolidone, (meth)acrylonitrile, vinyl acetate, styrene, α-methyl styrene, or vinyl ether. The ethylenically unsaturated monomer (e) can be one of these materials or a combination of two or more of these materials.

In particular, it is preferred to use the straight-chained or branch-chained alkyl ester of (meth)acrylic acid, (meth) acrylic acid alicyclic ester, hydroxyalkyl (meth)acrylate, alkoxyalkyl (meth)acrylate, or the maleimide compound. In this case, there is an advantage that it becomes easy to control the hydrophobicity, the film hardness of the ultraviolet curable resin composition, and the hardness of the solder resist.

When using the ethylenically unsaturated monomer (e), it is preferred that an amount of the ethylenically unsaturated monomer (e) is within a range of 1 to 60 mol %, preferably 1 to 55 mol %, and more preferably 10 to 50 mol % with respect to the total amount of the ethylenically unsaturated monomer component used to prepare the copolymer. In this range, it is possible to stably obtain a sufficient introduction amount of ethylenically unsaturated group into the ultraviolet curable resin (A). In addition, it becomes easy to control the hydrophilicity and the hardness of the cured film.

The copolymer can be prepared according to a conventional polymerization method such as solution polymerization or emulsion polymerization. For example, when adopting the solution polymerization, a polymerization initiator is added to the ethylenically unsaturated monomer component, i.e., a mixture of the ethylenically unsaturated monomer (a) and the compound (b), or a mixture of the ethylenically unsaturated monomer (a), the compound (b) and the ethylenically unsaturated monomer (e), in the presence of a suitable organic solvent. Then, the mixture is polymerized under a reflux condition. Alternatively, the mixture is heated and agitated under a nitrogen gas flow to cause polymerization.

As the organic solvent, for example, it is possible to use ketone such as methyl ethyl ketone and cyclohexanone, aromatic hydrocarbon such as toluene and xylene, acetic ester such as ethyl acetate, butyl acetate, cellosolve acetate, butyl cellosolve acetate, butyl carbitol acetate and propylene glycol monomethyl ether acetate, or dialkyl glycol ether. The organic solvent can be one of these materials or a mixture of two or more of these materials.

As the polymerization initiator for the solution polymerization, for example, it is possible to use a peroxide such as t-butyl hydroperoxide, di-t-butyl peroxide, lauroyl peroxide, benzoyl peroxide and di-isopropyl peroxy dicarbonate, or an azo compound such as azobisisobutylonitrile, 2, 2'-azobisisomethyl butyrate and azobiscyanovaleronitrile. The polymerization initiator can be one of these materials or a combination of two or more of these materials.

<(c) ethylenically unsaturated monomer having carboxyl group>

Next, the obtained copolymer is reacted with the ethylenically unsaturated monomer (c) having carboxyl group to obtain the chemical intermediate. As the ethylenically unsaturated monomer (c) having carboxyl group, for example, it is possible to use (meth)acrylic acid, crotonic acid, cinnamic acid, a compound having single ethylenically unsaturated group such as 2-(meth)acryloyl hydroxyethyl hexahydrophthalic acid, 2-(meth)acryloyl hydroxyethyl tetrahydrophthalic acid, 2-(meth)acryloyl hydroxyethyl phthalic acid, 2-(meth)acryloyl hydroxyethyl succinic acid, β-carboxyethyl acrylate, acryloyloxyethyl succinate, 2-propenoic acid, 3-(2-carboxyethoxy)-3-oxopropyl ester, or a compound having a plurality of ethylenically unsaturated groups, e.g., a compound obtained by reacting a dibasic acid anhydride with a polyfunctional acrylate having hydroxyl group such as dipentaerythritol penta(meth) acrylate, trimethylol-propane di(meth)acrylate, and pentaerythritol tri(meth)acrylate. The ethylenically unsaturated monomer (c) can be one of these materials or a combination of two or more of these materials. In particular, it is preferred to use the compound having single carboxyl group such as (meth)acrylic acid, or (meth)acrylic acid as the main ingredient.

It is preferred that a compounding amount of the ethylenically unsaturated monomer (c) is determined such that a chemical equivalent of carboxyl group per 1 epoxy equivalent of the copolymer is within a range of 0.7 to 1.2, preferably 0.9 to 1.1, and more preferably 0.95 to 1.1.

In the above range, the ultraviolet curable resin composition of the present invention has an especially wide developing width. In addition, it is possible to remarkably reduce the influence of the remaining ethylenically unsaturated monomer (c) having unreacted carboxyl group.

<(d) saturated or unsaturated polybasic acid anhydride>

To obtain the ultraviolet curable resin (A), the chemical intermediate is reacted with (d) the saturated or unsaturated polybasic acid anhydride. As the saturated or unsaturated polybasic acid anhydride (d), for example, it is possible to use a dibasic acid anhydride such as succinic anhydride, methyl succinic anhydride, maleic anhydride, citraconic anhydride, glutaric anhydride, itaconic anhydride, phthalic anhydride, tetrahydrophthalic anhydride, methyl tetrahydrophthalic anhydride, methyl nadic acid anhydride, hexahydrophthalic anhydride, and methyl hexahydrophthalic anhydride, or a polybasic acid anhydride such as trimellitic acid anhydride, pyromellitic acid anhydride, benzophenone tetracarboxylic anhydride and methyl cyclohexene tetracarboxylic anhydride. The saturated or unsaturated polybasic acid anhydride (d) can be one of these materials or a combination of two or more of these materials.

The principal purpose of compounding the saturated or unsaturated polybasic acid anhydride (d) is to provide an acid value to the ultraviolet curable resin (A) so that the ultraviolet curable resin (A) has re-dispersion and re-dissolution properties by a diluted alkaline aqueous solution. It is preferred that a compounding amount of the saturated or unsaturated polybasic acid anhydride (d) is determined such that the acid value of the ultraviolet curable resin (A) is within a range of 25 to 150 mgKOH/g, and particularly 40 to 100 mgKOH/g. When the acid value is less than 25 mgKOH/g, there is a fear that the developability becomes poor. On the other hand, when the acid value is more than 150 mgKOH/g, the electrical corrosion resistance, resistance to water, and the electrical properties of the solder resist may deteriorate due to the remaining carboxyl group in the resist after thermosetting.

The reaction of adding the ethylenically unsaturated monomer (c) to the copolymer and the reaction of adding the saturated or unsaturated polybasic acid anhydride (d) to the chemical intermediate can be carried out by conventional methods. For example, the addition reaction of the ethylenically unsaturated monomer (c) can be performed by adding a thermal polymerization inhibitor and a catalyst such as a tertiary amine, quaternary ammonium salt or triphenyl stibine to a solvent solution of the copolymer, and agitating the resultant mixture. It is preferred that this addition reaction is performed at a temperature of 60 to 150° C., and more preferably 80 to 120° C. The addition reaction of the saturated or unsaturated polybasic acid anhydride (d) can be performed according to the similar manner to the above.

In the present invention, it is preferred that a weight-average molecular weight of the ultraviolet curable resin (A) is within a range of 3,000 to 400,000. When the weight-average molecular weight is more than 400,000, there is a fear that although the sensitivity is apparently good, the resolution becomes insufficient. On the other hand, when the weight-average molecular weight is less than 3,000, the sensitivity easily lowers. It is preferred that a compounding amount of the ultraviolet curable resin (A) is within a range of 10 to 80 wt % with respect to a total amount of components of the ultraviolet curable resin composition of the present invention except for an organic solvent in a diluent (D) explained later. When this condition is satisfied, the ultraviolet curable resin composition exhibits excellent ultraviolet curability. In addition, the surface tackiness of a predried film of the resin composition is remarkably reduced.

[(B) epoxy compound having at least two epoxy groups in one molecule]

The ultraviolet curable resin composition of the present invention includes an epoxy compound (B) having at least two epoxy groups in one molecule. As this epoxy compound (B), for example, it is possible to use phenol novolac-type epoxy resin, cresol novolac-type epoxy resin, bisphenol A-type epoxy resin, bisphenol A-novolac-type epoxy resin, bisphenol F-type epoxy resin, triglycidyl isocyanurate, YX 4000 (manufactured by Yuka Shell Epoxy Kabushiki Kaisha), sorbitol polyglycidyl ether, N-glycidyl-type epoxy resin, alicyclic-type epoxy resin (e.g., "EHPE-3150" manufactured by Daicel Chemical Industries, Ltd.), polyol polyglycidyl ether compound, glycidyl ester compound, tris (hydroxyphenyl)methane-based polyfunctional epoxy resin (e.g., "EPPN-502H" manufactured by NIPPON KAYAKU Co., LTD. or "TACTIX-742" and "XD-9053" manufactured by DOW CHEMICAL), hydrogenated bisphenol A-type epoxy resin, dicyclopentadiene-phenol-type epoxy resin, naphthalene-type epoxy resin, or vinyl polymerization polymer having epoxy group. The epoxy compound (B) can be one of these materials or a combination of two or more of these materials, if necessary. In particular, it is preferred to use triglycidyl isocyanurate, YX 4000, phenol novolac-type epoxy resin, cresol novolac-type epoxy resin, bisphenol A-type epoxy resin, or bisphenol A-novolac-type epoxy resin.

It is preferred that a compounding amount of the epoxy compound (B) is within a range of 0.1 to 50 wt % with respect to the total amount of components of the ultraviolet curable resin composition of the present invention except for the organic solvent in the diluent (D). When this condition is satisfied, the ultraviolet curable resin composition exhibits excellent thermosetting property. In addition, a wider developing width of the resin composition is obtained.

[(C) photopolymerization initiator]

The ultraviolet curable resin composition of the present invention includes a photopolymerization initiator (C). As this photopolymerization initiator (C), for example, it is possible to use benzoin, an alkyl ether of benzoin such as benzoin methyl ether, benzoin ethyl ether and benzoin isopropyl ether, acetophenone such as acetophenone, 2, 2-dimethoxy-2-phenyl acetophenone, 2, 2-diethoxy-2-phenyl acetophenone, 1, 1-dichloroacetophenone and 1-hydroxy cyclohexyl phenylketone, anthraquinone such as 2-methyl anthraquinone and 2-amyl anthraquinone, thioxanthone such as 2, 4-dimethyl thioxanthone, 2, 4-diethyl thioxanthone, 2-chlorothioxanthone, 2, 4-diisopropyl thioxanthone and 1-chloro-4-propoxy thioxanthone, ketal such as acetophenone dimethylketal and benzyl dimethyl ketal, benzophenone or xanthone such as 3, 3-dimethyl-4-methoxy benzophenone, 3, 3', 4, 4'-tetra-(t-butyl peroxyl carbonyl) benzophenone and 4-benzoyl-4'-methyl diphenyl sulfido, nitrogen containing compound such as 2-methyl-1-[4-(methylthio)phenyl]-2-morpholino-1-propane-1-on, 2-benzyl-2-dimethylamino- 1 -(4-morpholinophenyl)-butane-1-one and 4, 4'-bis-diethyl aminobenzophenone, or 2, 4, 6-trimethyl benzoyldiphenyl phosphine oxide. The photo-polymerization initiator (C) can be one of these materials or a combination of two or more of these materials. The photo-polymerization initiator (C) may be used together with a conventional photopolymerization enhancer or sensitizer such as benzoic acid, and tertiary amine, e.g., p-dimethyl aminobenzoic acid ethyl ester, p-dimethyl aminobenzoic acid isoamyl ester, and 2-dimethyl aminoethyl benzoate.

It is preferred that a compounding amount of the photo-polymerization initiator (C) is within a range of 0.1 to 30 wt % with respect to the total amount of components of the ultraviolet curable resin composition of the present invention except for the organic solvent in the diluent (D). In this range, the ultraviolet curable resin composition exhibits excellent ultraviolet curability. In addition, further improved heat resistance and electrical corrosion resistance of the cured film of the resin composition are obtained. In addition, as a sensitizer for laser exposure, for example, it is possible to use a coumarin derivative such as 7-dimethylamino-4-methylcoumarin, 4, 6-diethyl-7-ethylaminocoumarin, or metallocene such as carbocyanine dye, xanthene dye, bis ($\eta^5$-2, 4-cyclopentadiene-1-yl)-bis(2,6-difluoro-3-(1H-pyrrole- 1 -yl)-phenyl) titanium. In this case, the ultraviolet curable resin composition can exhibit near-infrared curability or visual-light curability.

[(D) diluent]

The ultraviolet curable resin composition of the present invention includes the diluent (D). As this diluent (D), it is preferred to use an ethylenically unsaturated monomer having photopolymerization capability, organic solvent, or a mixture thereof. As the ethylenically unsaturated monomer having photopolymerization capability, for example, it is possible to use 2-hydroxy ethyl (meth)acrylate, 2-hydroxy propyl (meth)acrylate, N-vinyl pyrrolidone, (meth)acryloyl morpholine, methoxy tetraethylene glycol (meth)acrylate, methoxy polyethylene glycol (meth)acrylate, polyethylene glycol di(meth)acrylate, N, N-dimethyl (meth)acrylamide, N-methylol (meth)acrylamide, N, N-dimethyl aminopropyl (meth)acrylamide, N, N-dimethyl aminoethyl (meth) acrylate, N, N-dimethyl aminopropyl (meth)acrylate, melamine (meth)acrylate, diethylene glycol di(meth) acrylate, triethylene glycol di(meth)acrylate, propylene glycol di(meth)acrylate, tripropylene glycol di(meth)acrylate, phenoxyethyl (meth)acrylate, tetrahydrofurfuryl (meth) acrylate, cyclohexyl (meth)acrylate, trimethylolpropane di(meth)acrylate, trimethylolpropane tri(meth)acrylate, pentaerythritol tri(meth)acrylate, pentaerythritol tetra(meth) acrylate, dipentaerythritol penta(meth)acrylate, dipentaerythritol hexa(meth)acrylate, isobonyl (meth)acrylate, cyclopentanyl mono(meth)acrylate, cyclopentenyl mono (meth)acrylate, cyclopentanyl di(meth)acrylate, cyclopentenyl di(meth)acrylate, mono-, di-, tri-, or more-polyester obtained by reaction between polybasic acid and hydroxyalkyl (meth)acrylate, or (meth)acrylate monomer such as polyester (meth)acrylate and urethane (meth)acrylate. The ethylenically unsaturated monomer having photopolymerization capability can be one of these materials or a combination of two or more of these materials.

As the organic solvent, for example, it is possible to use alcohol such as ethanol, propyl alcohol, isopropyl alcohol, butyl alcohol, isobutyl alcohol, 2-butyl alcohol, hexanol, and ethylene glycol, ketone such as methyl ethyl ketone and cyclohexanone, aromatic hydrocarbon such as toluene and xylene, oil and aromatic mixture solvent such as "SWASOL SERIES" (manufactured by Maruzen Petrochemical Co., Ltd.), "SOLVESSO SERIES" (manufactured by EXXON CHEMICAL COMPANY), cellosolve such as cellosolve and butyl cellosolve, carbitol such as carbitol and butyl carbitol, propylene glycol alkyl ether such as propylene glycol methyl ether, polypropylene glycol alkyl ether such as dipropylene glycol methyl ether, acetic ester such as ethyl acetate, butyl acetate, cellosolve acetate, butyl cellosolve acetate, butyl carbitol acetate and propylene glycol monomethyl ether acetate, or dialkyl glycol ether. The organic solvent can be one of these materials or a combination of two or more of these materials.

When the ethylenically unsaturated monomer having photopolymerization capability is included in the diluent (D), it dilutes the ultraviolet curable resin (A) to provide improved handling and applying properties of the ultraviolet curable resin composition of the present invention, and adjust the acid value of the resin composition to provide the suitable photocurability. When the organic solvent is included in the diluent (D), it dissolves and dilutes the ultraviolet curable resin composition (A). As a result, the ultraviolet curable resin composition of the present invention can be easily applied on a desired substrate. By evaporating the organic solvent from the resin composition, a dried film of the resin composition is obtained on the substrate.

In case of using the ethylenically unsaturated monomer having the photocurability in the diluent (D), it is preferred that a compounding amount of the monomer is 50 wt % or less with respect to the total amount of components of the ultraviolet curable resin composition of the present invention except for the organic solvent in the diluent (D). When the compounding amount is more than 50 wt %, there is a fear that the surface tackiness of the predried film comes into problem. That is, when a negative photomask having a required pattern is directly put on the predried film, and then the exposure step is performed, a contamination of the photomask might occurs.

In case of using the organic solvent in the diluent (D), it is preferred that a compounding amount of the organic solvent is 5 wt % or more with respect to the total amount of components of the ultraviolet curable resin composition of the present invention. When the compounding amount is less than 5 wt %, there is a fear that it becomes difficult to uniformly apply the resin composition. An upper limit of the compounding amount of the organic solvent is not limited because a suitable compounding amount of the organic solvent is determined according to an applying method adopted. In particular, the use of the organic solvent is essential when the ultraviolet curable resin composition of the present invention is used as a photo solder resist ink developable with diluted alkaline aqueous solution. In this case, it is preferred that the organic solvent can be rapidly evaporated from the resin composition by predrying without being left in the predried film.

In addition to the above-explained components (A) to (D), the ultraviolet curable resin composition of the present invention may contain a blocked isocyanate, thermosetting component such as amino resin, ultraviolet curable epoxy (meth)acrylate, for example, a first compound obtained by adding (meth)acrylic acid to an epoxy resin such as bisphenol A-type epoxy resin, phenol novolac-type epoxy resin, cresol novolac-type epoxy resin and alicyclic epoxy resin, a second compound obtained by adding a saturate or unsaturated polybasic acid anhydride such maleic anhydride, succinic anhydride, itaconic anhydride, phthalic anhydride and tetrahydrophthalic anhydride to the first compound, ultraviolet curable polymer obtained by reacting hydroxyalkyl (meth)acrylate and (meth)acrylate having epoxy group with a copolymer of maleic anhydride and other ethylenically unsaturated monomer, copolymer of an ethylenically unsaturated compound such as styrene-(meth)acrylic acid-(meth)acrylic acid ester copolymer, ultraviolet curable polymer obtained by reacting an ethylenically unsaturated monomer having epoxy group with the copolymer, ultraviolet curable polymer obtained by adding (meth)acrylic acid to a vinyl copolymer containing the ethylenically unsaturated monomer having epoxy group as monomer unit, or a high molecular compound such as styrene-maleic resin, diallyl phthalate resin, phenoxy resin, melamine resin, urethane resin, and fluorine contained resin.

If necessary, the ultraviolet curable resin composition may contain an additive such as an epoxy resin curing agent, curing enhancer, filler, coloring agent, leveling agent, adhesion supplying agent, thixotropic agent, polymerization inhibitor, antihalation agent, flame retardant, defoamer, dispersion stabilizing agent, high molecular dispersing agent and an anti-oxidant.

For example, the ultraviolet curable resin composition of the present invention can be prepared according to the following method. The above-explained components and the optional compounds or additives can be mixed by use of three rolls, ball mill, sand mill, and so on. Then, a first mixture is prepared by mixing a part of the component (D) with the component (B). A second mixture is prepared by mixing the components (A) and (C) with the rest of the component (D). The first mixture is mixed with the second mixture immediately before the use of the resin composition of the present invention.

Following is a preferred method of forming a resist pattern on a substrate by use of a photo solder resist ink including the ultraviolet curable resin composition of the present invention.

For example, after the photo solder resist ink is applied to the substrate by means of dipping, spraying, spin coating, roll coating, curtain coating, screen printing, and so on, the resist ink film on the substrate is predried at a temperature of 60 to 120° C. to volatilize the organic solvent therefrom. Next, a negative mask having a required pattern is directly or indirectly put on the predried film, and ultraviolet is radiated to the predried film through the mask by use of a chemical lamp, low-pressure mercury lamp, intermediate-pressure mercury lamp, high-pressure mercury lamp, ultra-high-pressure mercury lamp, xenon lamp, metalhalide lamp, and so on. Then, a developing step is performed to obtain the resist pattern. In addition, a heat treatment is performed at a temperature of 120 to 180° C. for 30 to 90 minutes to cure the epoxy compound in the resist pattern. This heat treatment improves film strength, hardness and chemical resistance of the resist pattern.

As an alkaline solution used in the developing step, for example, it is possible to use an aqueous solution of sodium carbonate, potassium carbonate, ammonium carbonate, sodium hydrogencarbonate, potassium hydrogencarbonate, ammonium hydrogencarbonate, sodium hydroxide, potassium hydroxide, ammonium hydroxide, and lithium hydroxide. Besides the above alkaline solutions, it is possible to use an organic amine such as monoethanol amine, diethanol amine, triethanol amine, monoisopropanol amine, diisopropanol amine, and triisopropanol amine. These materials may be used either alone or as a mixture thereof. As a solvent for the alkaline solution, it is possible to use water, or a mixture of water and an organic solvent having hydrophilicity, e.g., a lower alcohol.

It is particularly preferred to use the ultraviolet curable resin composition of the present invention for the photo solder resist ink. In addition, it is possible to use the resin composition of the present invention as a composition for preparing color filter pixels by using a suitable coloring agent, for example, an organic pigment such as azo lake pigment, insoluble azo pigment and phthalocyanine pigment, inorganic pigment such as iron blue, iron oxide and cobalt, solvent dye, basic dye, disperse dye, or the like. Moreover, the resin composition of the present invention may be used for a film for protecting color filters.

EXAMPLES

The followings are Examples 1 to 8 of the present invention and Comparative Examples 1 to 3. However, the present invention is not limited to these Examples. Unless otherwise specified, the units "parts" and "%" used bellow designate "parts by weight" and "wt %", respectively.

[Preparation of ultraviolet curable resin solution (A-1)]

A mixture of 70 parts of glycidyl methacrylate, 10 parts of "NK Ester 9 G" [manufactured by SHINNAKAMURA CHEMICAL INDUSTRIAL CO., LTD., polyethylene glycol #400 dimethacrylate (n=9), molecular weight=536], 20 parts of methyl methacrylate, 100 parts of carbitol acetate, 0.2 parts of laurylmercaptan and 3 parts of azobisisobutyronitrile was polymerized in a four-mouth flask at a temperature of 80° C. for 5 hours under a nitrogen gas flow, while being agitated. The flask is provided with a reflux condenser, thermometer, glass tube for nitrogen substitution and an agitator. As a result of this polymerization, a 50% copolymer solution was obtained.

Next, 0.05 parts of hydroquinone, 37 parts of acrylic acid and 0.2 parts of dimethylbenzylamine were added to the copolymer solution to obtain a first mixture. After the first mixture was kept at 100° C. for 24 hours, 45 parts of tetrahydrophthalic anhydride and 79 parts of carbitol acetate were added to the first mixture to obtain a second mixture. The second mixture was kept at 100° C. for 3 hours to obtain a 50% ultraviolet curable resin solution (A-1).

[Preparation of ultraviolet curable resin solution (A-2)]

A mixture of 70 parts of glycidyl methacrylate, 10 parts of "NK Ester 9 PG" [manufactured by SHINNAKAMURA CHEMICAL INDUSTRIAL CO., LTD., polypropylene glycol #400 dimethacrylate (n=7), molecular weight=536], 15 parts of methyl methacrylate, 5 parts of t-butyl methacrylate, 100 parts of carbitol acetate and 3 parts of azobisisobutyronitrile was polymerized in a four-mouth flask at a temperature of 80° C. for 5 hours under a nitrogen gas flow, while being agitated. The flask is provided with a reflux condenser, thermometer, glass tube for nitrogen substitution and an agitator. As a result of this polymerization, a 50% copolymer solution was obtained.

Next, 0.05 parts of hydroquinone, 37 parts of acrylic acid and 0.2 parts of dimethylbenzylamine were added to the copolymer solution to obtain a first mixture. After the first mixture was kept at 100° C. for 24 hours, 38 parts of tetrahydrophthalic anhydride and 72 parts of carbitol acetate were added to the first mixture to obtain a second mixture. The second mixture was kept at 100° C. for 3 hours to obtain a 50% ultraviolet curable resin solution (A-2).

[Preparation of ultraviolet curable resin solution (A-3)]

A mixture of 70 parts of glycidyl methacrylate, 5 parts of "NK Ester A-BPE-4" [manufactured by SHINNAKAMURA CHEMICAL INDUSTRIAL CO., LTD., 2, 2-bis[4-(acryloxy. diethoxy)phenyl] propane, molecular weight=512], 15 parts of methyl methacrylate, 10 parts of cyclohexyl maleimide, 100 parts of carbitol acetate, 0.1 parts of laurylmercaptan and 3 parts of azobisisobutyronitrile was polymerized in a four-mouth flask at a temperature of 80° C. for 5 hours under a nitrogen gas flow, while being agitated. The flask is provided with a reflux condenser, thermometer, glass tube for nitrogen substitution and an agitator. As a result of this polymerization, a 50% copolymer solution was obtained.

Next, 0.05 parts of hydroquinone, 37 parts of acrylic acid and 0.2 parts of dimethylbenzylamine were added to the copolymer solution to obtain a first mixture. After the first mixture was kept at 100° C. for 24 hours, 38 parts of tetrahydrophthalic anhydride and 72 parts of carbitol acetate were added to the first mixture to obtain a second mixture. The second mixture was kept at 100° C. for 3 hours to obtain a 50% ultraviolet curable resin solution (A-3).

[Preparation of ultraviolet curable resin solution (A-4)]

A mixture of 70 parts of glycidyl methacrylate, 14 parts of "BULENMER 43DB-40B" [manufactured by NOF Corp., bisphenol-A polyethylene glycol polypropylene glycol adduct dimethacrylate, molecular weight=about 1180], 6 parts of methyl methacrylate, 10 parts of t-butyl methacrylate, 100 parts of carbitol acetate, 0.3 parts of laurylmercaptan and 3 parts of azobisisobutyronitrile was polymerized in a four-mouth flask at a temperature of 80° C. for 5 hours under a nitrogen gas flow, while being agitated. The flask is provided with a reflux condenser, thermometer, glass tube for nitrogen substitution and an agitator. As a result of this polymerization, a 50% copolymer solution was obtained.

Next, 0.05 parts of hydroquinone, 37 parts of acrylic acid, and 0.2 parts of dimethylbenzylamine were added to the copolymer solution to obtain a first mixture. After the first mixture was kept at 105° C. for 24 hours, 38 parts of tetrahydrophthalic anhydride and 72 parts of carbitol acetate were added to the first mixture to obtain a second mixture. The second mixture was kept at 100° C. for 3 hours to obtain a 50% ultraviolet curable resin solution (A-4).

[Preparation of ultraviolet curable resin solution (A-5)]

A mixture of 70 parts of glycidyl methacrylate, 10 parts of "NK Ester TMPT" [manufactured by SHINNAKAMURA CHEMICAL INDUSTRIAL CO., LTD., trimethylolpropane trimethacrylate, molecular weight=338], 15 parts of methyl methacrylate, 5 parts of t-butyl methacrylate, 100 parts of carbitol acetate, 0.2 parts of laurylmercaptan and 3 parts of azobisisobutyronitrile was polymerized in a four-mouth flask at a temperature of 80° C. for 5 hours under a nitrogen gas flow, while being agitated. The flask is provided with a reflux condenser, thermometer, glass tube for nitrogen substitution and an agitator. As a result of this polymerization, a 50% copolymer solution was obtained.

Next, 0.05 parts of hydroquinone, 37 parts of acrylic acid and 0.2 parts of dimethylbenzylamine were added to the copolymer solution to obtain a first mixture. After the first mixture was kept at 105° C. for 24 hours, 38 parts of tetrahydrophthalic anhydride and 72 parts of carbitol acetate were added to the first mixture to obtain a second mixture. The second mixture was kept at 100° C. for 3 hours to obtain a 50% ultraviolet curable resin solution (A-5).

[Preparation of ultraviolet curable resin solution (A-6)]

A mixture of 80 parts of glycidyl methacrylate, 20 parts of "NK Ester 9G" [manufactured by SHINNAKAMURA CHEMICAL NDUSTRIAL CO., LTD., polyethylene glycol #400 dimethacrylate (n=9), molecular weight=536], 100 parts of carbitol acetate, 0.2 parts of laurylmercaptan and 3 parts of azobisisobutyronitrile was polymerized in a four-mouth flask at a temperature of 80° C. for 5 hours under a nitrogen gas flow, while being agitated. The flask is provided with a reflux condenser, thermometer, glass tube for nitrogen substitution and an agitator. As a result of this polymerization, a 50% copolymer solution was obtained.

Next, 0.05 parts of hydroquinone, 42.6 parts of acrylic acid and 0.2 parts of dimethylbenzylamine were added to the copolymer solution to obtain a first mixture. After the first mixture was kept at 100° C. for 24 hours, 45 parts of tetrahydrophthalic anhydride and 84 parts of carbitol acetate were added to the first mixture to obtain a second mixture. The second mixture was kept at 100° C. for 3 hours to obtain a 50% ultraviolet curable resin solution (A-6).

[Preparation of ultraviolet curable resin solution (A-7)]

A mixture of 70 parts of glycidyl methacrylate, 1 part of "NK Ester 9PG" [manufactured by SHINNAKAMURA CHEMICAL INDUSTRIAL CO., LTD., polypropylene glycol #400 dimethacrylate (n=7), molecular weight=536], 15 parts of methyl methacrylate, 14 parts of t-butyl methacrylate, 100 parts of carbitol acetate and 3 parts of azobisisobutyronitrile was polymerized in a four-mouth flask at a temperature of 80° C. for 5 hours under a nitrogen gas flow, while being agitated. The flask is provided with a reflux condenser, thermometer, glass tube for nitrogen substitution and an agitator. As a result of this polymerization, a 50% copolymer solution was obtained.

Next, 0.05 parts of hydroquinone, 37 parts of acrylic acid and 0.2 parts of dimethylbenzylamine were added to the copolymer solution to obtain a first mixture. After the first mixture was kept at 100° C. for 24 hours, 38 parts of tetrahydrophthalic anhydride and 72 parts of carbitol acetate were added to the first mixture to obtain a second mixture. The second mixture was kept at 100° C. for 3 hours to obtain a 50% ultraviolet curable resin solution (A-7).

[Preparation of ultraviolet curable resin solution (A-8)]

A mixture of 70 parts of glycidyl methacrylate, 30 parts of "NK Ester TMPT" [manufactured by SHINNAKAMURA CHEMICAL INDUSTRIAL CO., LTD., trimethylolpropane trimethacrylate, molecular weight=338], 100 parts of carbitol acetate, 0.2 parts of laurylmercaptan and 3 parts of azobisisobutyronitrile was polymerized in a four-mouth flask at a temperature of 80° C. for 5 hours under a nitrogen gas flow, while being agitated. The flask is provided with a reflux condenser, thermometer, glass tube for nitrogen substitution and an agitator. As a result of this polymerization, a 50% copolymer solution was obtained.

Next, 0.05 parts of hydroquinone, 37 parts of acrylic acid and 0.2 parts of dimethylbenzylamine were added to the copolymer solution to obtain a first mixture. After the first mixture was kept at 105° C. for 24 hours, 38 parts of tetrahydrophthalic anhydride and 72 parts of carbitol acetate were added to the first mixture to obtain a second mixture. The second mixture was kept at 100° C. for 3 hours to obtain a 50% ultraviolet curable resin solution (A-8).

[Preparation of ultraviolet-curable resin solution (E-1)]

A mixture of 70 parts of glycidyl methacrylate, 20 parts of methyl methacrylate, 10 parts of t-butyl methacrylate, 100 parts of carbitol acetate, 0.2 parts of laurylmercaptan and 3 parts of azobisisobutyronitrile was polymerized in a four-mouth flask at a temperature of 80° C. for 5 hours under a nitrogen gas flow, while being agitated. The flask is provided with a reflux condenser, thermometer, glass tube for nitrogen substitution and an agitator. As a result of this polymerization, a 50% copolymer solution was obtained.

Next, 0.05 parts of hydroquinone, 37 parts of acrylic acid and 0.2 parts of dimethylbenzylamine were added to the copolymer solution to obtain a first mixture. After the first mixture was kept at 100° C. for 24 hours, 45 parts of tetrahydrophthalic anhydride and 79 parts of carbitol acetate were added to the first mixture to obtain a second mixture. The second mixture was kept at 100° C. for 3 hours to obtain a 50% ultraviolet curable resin solution (E-1).

[Preparation of ultraviolet-curable resin solution (E-2)]

214 parts of an epoxy compound "EPICLON N-680" (manufactured by DAINIPPON INK AND CHEMICALS INCORPORATED, Epoxy Equivalents: 214) was dissolved in 60 parts of carbitol acetate to obtain a first mixture. The epoxy compound is a cresol novolac-type epoxy resin. Next, 74 parts of acrylic acid, 0.1 parts of hydroquinone and 0.7 parts of benzyldimethylamine were added to the first mixture, while the first mixture being agitated, and then the resultant mixture was kept at a temperature of 90 to 100° C. for 24 hours to obtain a second mixture. After 95 parts of carbitol acetate was added to the second mixture, the resultant was agitated and cooled to obtain an epoxy acrylate solution. Continuously, 76 parts of tetrahydrophthalic anhydride and 87 parts of carbitol acetate were added to the epoxy acrylate solution to obtain a third mixture. The third mixture is kept at 100° C. for 3 hours to obtain a 60% ultraviolet-curable resin solution (E-2).

Liquid-type photo solder resist inks developable with diluted alkaline aqueous solution of Examples 1 to 8 and Comparative Examples 1 to 3 were produced by a three-roll mixing method according to compounding amounts listed in Table 1.

In Table 1, "EPICLON N-695" is a cresol novolac-type epoxy resin (manufactured by DAINIPPON INK AND CHEMICALS INCORPORATED). "YX 4000" is an epoxy compound (manufactured by Yuka Shell Epoxy Kabushiki Kaisha, epoxy equivalent: 195). "TEPIC-S" is triglycidyl isocyanurate (manufactured by NISSAN CHEMICAL INDUSTRIES, epoxy equivalent: 100). "IRGACURE 907" is a photopolymerization initiator (manufactured by CIBA-GEIGY CORPORATION, (2-methyl-1-[4-methylthio (phenyl)]-2-morpholinopropane-1-on)). "KAYACURE DETX-S" is a photopolymerization initiator (manufactured by Nippon Kayaku Co., Ltd., 2, 4-diethyl thioxanthone). "MODAFLOW" is a leveling agent (manufactured by MONSANTO COMPANY). "SWASOL 1500" is an oil and aromatic mixture solvent (manufactured by Maruzen Petrochemical Co., Ltd.).

With respect to the photo solder resist inks of Examples 1–8 and Comparative Examples 1–3, the following performance evaluations were performed. Results are shown in Table 2.

Surface Tackiness

Each of the photo solder resist inks was applied on copper clad laminates by screen printing to obtain test samples. Each of the clad laminates is formed with a glass epoxy substrate and a 35 μm-thickness copper foil on the substrate. To volatilize the solvent component from the applied resist ink, the test samples were dried at 80° C. for three different drying times, i.e., 10, 20 and 30 minutes, to thereby obtain three kinds of dried resist ink films having a thickness of about 20 μm as test pieces. Next, a mask having a required pattern was directly put on each of the dried resist ink films under a reduced pressure to obtain intimate contact therebetween, and 150 mJ/cm$^2$ of ultraviolet light was radiated to the respective resist ink film through the mask.

After the ultraviolet radiation, the surface tackiness of the dried resist ink film was evaluated by removing the mask from the resist ink film. In Table 2, the symbol "○" designates that the mask could be readily removed from the dried resist ink film without remaining a sign of the mask on the resist ink film. The symbol "Δ" designates that the mask could be removed from the dried resist ink film, but the sign of the mask remained on the resist ink film. The symbol "X" designates that it was difficult to remove the mask from the resist ink film, and when the mask was forcedly removed from the resist ink film, a considerable damage of the mask occurred.

Developing Width (Predrying Time Acceptable Range)

Each of the photo solder resist inks was applied on copper clad laminates by screen-printing to obtain test samples. The clad laminate is formed with a glass epoxy substrate and a 35 μm-thickness copper foil on the substrate. To volatilize the solvent component from the applied resist ink, the test samples were dried at 80° C. for nine different drying times, i.e., 10, 20, 30, 40, 50, 60, 70, 80 and 90 minutes, to thereby obtain nine kinds of dried resist ink films having a thickness of about 20 μm as test pieces. A mask having a required pattern was directly put on each of the dried resist ink films under a reduced pressure to obtain intimate contact therebetween, and then an optimum amount of ultraviolet light was radiated to the respective resist ink film through the mask. After the ultraviolet radiation, each of the resist ink films was developed by use of a 1% sodium carbonate aqueous solution. The developability of the resist ink film was evaluated according to the following criteria for evaluation. In Table 2, the symbol "○" designates that unexposed portions of the resist ink film could be readily developed, so that a sharp pattern of the resist ink film was obtained. The symbol "Δ" designates that it took an extended time period to develop the unexposed portions, and it was difficult to obtain a fine pattern of the resist ink film. The symbol "X" designates that it was difficult to develop the unexposed portions, so that the pattern formation was impossible.

Remaining Step Number

Each of the photo solder resist inks was applied on copper clad laminates by screen-printing to obtain test samples. The clad laminate is formed with a glass epoxy substrate and a 35 μm-thickness copper foil on the substrate. To volatilize the solvent component from the applied resist ink, the test samples were dried at 80° C. for 20 minutes to obtain dried resist ink films having a thickness of about 20 μm as test pieces. A mask "STEP TABLET PHOTEC" used as an exposure-test material (manufactured by Hitachi Chemical Co., Ltd.) was put on each of the dried resist ink films under a reduced pressure to obtain intimate contact therebetween. 50 mJ/cm$^2$ of ultraviolet light was radiated to one of the dried resist ink films through the mask. 150 mJ/cm$^2$ of ultraviolet light was radiated to the other one of the dried resist ink films through the mask. Then, each of these resist ink films was developed by use of a 1% sodium carbonate aqueous solution. After developing, the remaining step number was counted to evaluate a degree of exposure sensitivity.

To perform performance evaluations of printed wiring boards manufactured by use of the photo solder resist inks of Examples 1–8 and Comparative Examples 1–3, test pieces were produced according to the following steps (I) to (V).

(I)<Applying Step>

Each of the photo solder resist inks was applied on a substrate having a conductive pattern by screen printing to obtain a resist ink film thereon. The substrate is a copper clad laminate, which is formed with a glass epoxy substrate and a 35 μm-thickness copper foil on the substrate. The conductive pattern was obtained by previously etching the copper foil along a desired pattern.

(II)<Predrying Step>

To volatilize the solvent component from the resist ink film, the resist ink film was predried at 80° C. for 20 minutes to obtain a predried ink film having a thickness of about 20 μm.

(III)<Exposing Step>

After a mask having a desired pattern was directly put on the predried ink film, an optimum amount of ultraviolet light was radiated to the predried ink film through the mask.

(IV)<Developing Step>

Unexposed portions of the resist ink film were selectively removed by use of a 1% sodium carbonate aqueous solution to obtain a pattern of the exposed resist ink film on the substrate.

(V)<Post-baking Step>

After the developing step, the pattern of the resist ink film on the substrate was further cured at 150° C. for 30 minutes to obtain a solder resist as the test piece.

Resolution

The mask used in the exposing step has a plurality of slits formed in concentric circles. A slit width and a distance between adjacent slits are 40 μm, respectively. A state of the obtained solder resist pattern was observed to evaluate the resolution. In Table 2, the symbol "○" designates that a sharp solder resist pattern could be obtained and no crack or chipping was observed. The symbol "Δ" designates that the solder resist pattern could be obtained, but the occurrence of some cracks or defects was observed. The symbol "X" designates that the solder resist pattern could not be formed.

Heat Resistance to Molten Solder

A water-soluble flux "LONCO 3355–11" (manufactured by London Chemical Co., Ltd.) was applied on the test pieces. One of the test pieces was dipped once in a molten solder bath kept at 260° C. for 15 seconds. As to the other one of the test pieces, the same dipping operation was repeated five times. Subsequently, these test pieces were washed with water. In each of the test pieces, a degree of discoloration-to-white was observed. In Table 2, the symbol "⊚" designates that there was no discoloration-to-white. The symbol "○" designates that the discoloration-to-white slightly occurred. The symbol "Δ" designates that the discoloration-to-white occurred. The symbol "X" designate that the discoloration-to-white remarkably occurred.

In addition, a crosscut adhesion test was performed according to JIS (Japan Industrial Standard) D 0202 by use of a cellophane adhesive tape. In Table 2, the symbol "○" designates that there was no peeling of the solder resist at crosscut portions. The symbol "Δ" designates that peeling of the solder resist was partially observed at the crosscut portions. The symbol "X" designates that peeling of the solder resist already occurred before the crosscut adhesion test.

Film Hardness by Pencil Lead (Pencil Hardness)

A hardness of the solder resist was measured by using a pencil "Mitsubishi Hi-Uui" (manufactured by MITSUBISHI PENCIL Co., Ltd.) according to JIS K 5400.

Resistance to Gold Plating

Plating was performed on the test piece by use of electroless nickel and gold plating baths. Then, an adhesion test was performed to evaluate the resistance to gold plating. In Table 2, the symbol "○" designates that there was no peeling. The symbol "Δ" designates that there was no change of the appearance, but peeling partially occurred when an adhesive tape was removed. The symbol "X" designates that peeling was observed before the adhesion test.

Electrical Corrosion Resistance

By use of the photo solder resist inks of Examples 1 to 8 and Comparative Examples 1 to 3, specimens for evaluating the electrical corrosion resistance were prepared through substantially same steps as the above-explained steps (I) to (V) except that a spit-type electrode B of IPC B-25 was used in place of the foregoing substrate. A bias voltage of DC 100 V was loaded to the spit-type electrode, and the presence or absence of migration after the elapse of 500 hours under conditions of 40° C. and 90% R. H. was checked. In Table 2, the symbol "○" designates that no migration could be observed. The symbol "Δ" designates that only a small amount of migration could be observed. The symbol "X" designates that apparent migration occurred.

As understood from Tables 1 and 2, each of the photo solder resist inks of Examples 1 to 8 shows improved developing width and heat resistance, excellent adhesion, chemical resistance, electrical corrosion resistance, and resistance to gold plating, as compared with those of Comparative Examples 1–3. In addition, Examples 1 to 4, 6 and 7 using di(meth)acrylate having the oxyalkylene unit as the compound (b) are particularly preferred to improve the developing width and resistance to gold plating.

TABLE 1

| Composition | Example 1 | 2 | 3 | 4 | 5 | 6 | 7 | 8 | Comparative Example 1 | 2 | 3 |
|---|---|---|---|---|---|---|---|---|---|---|---|
| ultraviolet curable resin solution (A-1) | 50 | — | — | — | — | — | — | — | — | — | — |
| ultraviolet curable resin solution (A-2) | — | 50 | — | — | — | — | — | — | — | — | — |
| ultraviolet curable resin solution (A-3) | — | — | 50 | — | — | — | — | — | — | — | — |
| ultraviolet curable resin solution (A-4) | — | — | — | 50 | — | — | — | — | — | — | — |
| ultraviolet curable resin solution (A-5) | — | — | — | — | 50 | — | — | — | — | — | — |
| ultraviolet curable resin solution (A-6) | — | — | — | — | — | 50 | — | — | — | — | — |
| ultraviolet curable resin solution (A-7) | — | — | — | — | — | — | 50 | — | — | — | — |
| ultraviolet curable resin solution (A-8) | — | — | — | — | — | — | — | -50- | — | — | — |
| ultraviolet curable resin solution (E-1) | — | — | — | — | — | — | — | — | 50 | 50 | — |
| ultraviolet curable resin solution (E-2) | — | — | — | — | — | — | — | — | — | — | 50 |
| EPICLON N-695 | 10 | 10 | — | 10 | — | — | 10 | 10 | 10 | — | — |
| YX-4000 | — | — | — | — | 10 | — | — | — | — | 10 | — |
| TEPIC-S | — | — | 10 | — | — | 10 | — | — | — | — | 10 |
| IRGACURE 907 | 4 | 4 | 4 | 4 | 4 | 4 | 4 | 4 | 4 | 4 | 4 |
| KAYACURE DETX-S | 0.5 | 0.5 | 0.5 | 0.5 | 0.5 | 0.5 | 0.5 | 0.5 | 0.5 | 0.5 | 0.5 |
| MODAFLOW | 1 | 1 | 1 | 1 | 1 | 1 | 1 | 1 | 1 | 1 | 1 |
| silica (average grain size: 1 μm) | 10 | 10 | 10 | 10 | 10 | 10 | 10 | 10 | 10 | 10 | 10 |
| barium sulfate | 17 | 17 | 17 | 17 | 17 | 17 | 17 | 17 | 17 | 17 | 17 |
| melamine | 1 | 1 | 1 | 1 | 1 | 1 | 1 | 1 | 1 | 1 | 1 |
| pthalocyanine green | 0.5 | 0.5 | 0.5 | 0.5 | 0.5 | 0.5 | 0.5 | 0.5 | 0.5 | 0.5 | 0.5 |
| SWASOL 1500 | 1 | 1 | 1 | 1 | 1 | 1 | 1 | 1 | 1 | 1 | 1 |

TABLE 2

| performance evaluation | | Example 1 | 2 | 3 | 4 | 5 | 6 | 7 | 8 | Comparative Example 1 | 2 | 3 |
|---|---|---|---|---|---|---|---|---|---|---|---|---|
| predrying | surface tackiness | | | | | | | | | | | |
| property/drying temperature: 80° C. | drying time: 10 min | ○ | ○ | ○ | ○ | ○ | ○ | ○ | ○ | Δ | Δ | Δ |
| | drying time: 20 min | ○ | ○ | ○ | ○ | ○ | ○ | ○ | ○ | ○ | ○ | Δ |
| | drying time: 30 min | ○ | ○ | ○ | ○ | ○ | ○ | ○ | ○ | ○ | ○ | ○ |
| predrying time acceptable range (developing width) | | | | | | | | | | | | |
| | drying time: 10 min | ○ | ○ | ○ | ○ | ○ | ○ | ○ | ○ | ○ | ○ | ○ |
| | drying time: 20 min | ○ | ○ | ○ | ○ | ○ | ○ | ○ | ○ | ○ | ○ | ○ |
| | drying time: 30 min | ○ | ○ | ○ | ○ | ○ | ○ | ○ | ○ | ○ | ○ | ○ |
| | drying time: 40 min | ○ | ○ | ○ | ○ | ○ | ○ | ○ | ○ | ○ | ○ | ○ |
| | drying time: 50 min | ○ | ○ | ○ | ○ | ○ | ○ | ○ | ○ | ○ | ○ | ○ |
| | drying time: 60 min | ○ | ○ | ○ | ○ | ○ | ○ | ○ | ○ | ○ | ○ | ○ |
| | drying time: 70 min | ○ | ○ | ○ | ○ | ○ | ○ | ○ | ○ | Δ | ○ | Δ |
| | drying time: 80 min | ○ | ○ | ○ | ○ | Δ | ○ | ○ | Δ | Δ | Δ | Δ |
| | drying time: 90 min | ○ | ○ | ○ | ○ | Δ | ○ | ○ | Δ | X | X | X |

TABLE 2-continued

| | | | Example | | | | | | | | Comparative Example | | |
|---|---|---|---|---|---|---|---|---|---|---|---|---|---|
| performance evaluation | | | 1 | 2 | 3 | 4 | 5 | 6 | 7 | 8 | 1 | 2 | 3 |
| remaining step number | exposure amount: 50 mJ/cm$^2$ | | 5 | 5 | 5 | 5 | 5 | 5 | 5 | 6 | 5 | 5 | 5 |
| | exposure amount: 150 mJ/cm$^2$ | | 8 | 8 | 8 | 8 | 8 | 8 | 8 | 9 | 8 | 8 | 8 |
| properties of test piece under optimum exposure condition | resolution | | ○ | ○ | ○ | ○ | ○ | ○ | ○ | ○ | ○ | ○ | ○ |
| | adhesion between solder resist and substrate | | ○ | ○ | ○ | ○ | ○ | ○ | ○ | ○ | ○ | ○ | ○ |
| | heat resistance to molten solder | soldering (1 time) | | | | | | | | | | | |
| | | discoloration to white | ○ | ○ | ⊚ | ⊚ | ○ | ○ | ○ | ○ | ○ | ○ | ○ |
| | | adhesion | ○ | ○ | ⊚ | ⊚ | ○ | ○ | ○ | ○ | ○ | ○ | ○ |
| | | soldering (5 times) | | | | | | | | | | | |
| | | discoloration to white | ○ | ○ | ○ | ○ | ○ | ○ | ○ | ○ | Δ | Δ | Δ |
| | | adhesion | ○ | ○ | ○ | ○ | ○ | ○ | ○ | ○ | Δ | x | Δ |
| | pencil hardness | | 6H | 6H | 5H | 6H | 5H | 5H | 6H | 5H | 6H | 5H | 5H |
| | resistance to gold plating | | ○ | ○ | ○ | ○ | Δ | ○ | ○ | Δ | Δ | x | x |
| | electrical corrosion resistance | | ○ | ○ | ○ | ○ | ○ | ○ | ○ | ○ | ○ | ○ | ○ |

What is claimed is:

1. An ultraviolet curable resin composition including:
   (A) an ultraviolet curable resin obtained by the steps of:
   polymerizing an ethylenically unsaturated monomer component containing (a) an ethylenically unsaturated monomer having epoxy group and (b) a compound having at least two ethylenically unsaturated groups in one molecule to prepare a copolymer;
   reacting said copolymer with (c) an ethylenically unsaturated monomer having carboxyl group to prepare a chemical intermediate; and
   reacting said chemical intermediate with (d) one of saturated and unsaturated polybasic acid anhydrides;
   (B) an epoxy compound having at least two epoxy groups in one molecule;
   (C) a photopolymerization initiator; and
   (D) a diluent,
   wherein said ultraviolet-curable resin composition is a photo solder resist ink.

2. The ultraviolet curable resin composition as set forth in claim 1, wherein said ethylenically unsaturated monomer component further contains (e) an ethylenically unsaturated monomer capable of copolymerizing with said ethylenically unsaturated monomer (a) and said compound (b).

3. The ultraviolet curable resin composition as set forth in claim 1, wherein said ethylenically unsaturated monomer (a) includes glycidyl (meth)acrylate.

4. The ultraviolet curable resin composition as set forth in claim 2, wherein said ethylenically unsaturated monomer (a) includes glycidyl (meth)acrylate.

5. The ultraviolet curable resin composition as set forth in claim 1, wherein said compound (b) is di(meth)acrylate.

6. The ultraviolet curable resin composition as set forth in claim 1, wherein said compound (b) is di(meth)acrylate having at least one oxyalkylene unit.

7. The ultraviolet curable resin composition as set forth in claim 1, wherein an amount of said compound (b) is within a range of 0.1 to 10 mol % with respect to the total amount of said ethylenically unsaturated monomer component used to prepare said copolymer.

8. The ultraviolet curable resin composition as set forth in claim 1, wherein an amount of said compound (b) is within a range of 0.1 to 7 mol % with respect to the total amount of said ethylenically unsaturated monomer component used to prepare said copolymer.

9. A predried film obtained by drying the ultraviolet curable resin composition as set forth in claim 1.

10. A printed wiring board having a cured film of the ultraviolet curable resin composition as set forth in claim 1.

11. An ultraviolet curable resin composition including:
   (A) an ultraviolet curable resin obtained by the steps of:
   polymerizing an ethylenically unsaturated monomer component containing (a) an ethylenically unsaturated monomer having epoxy group and (b) a di(meth) acrylate to prepare a copolymer;
   reacting said copolymer with (c) an ethylenically unsaturated monomer having carboxyl group to prepare a chemical intermediate; and
   reacting said chemical intermediate with (d) one of saturated and unsaturated polybasic acid anhydrides;
   (B) an epoxy compound having at least two epoxy groups in one molecule;
   (C) a photopolymerization initiator; and
   (D) a diluent,
   wherein said ultraviolet-curable resin composition is a photo solder resist ink.

* * * * *